United States Patent
Karpov et al.

(10) Patent No.: US 11,094,358 B2
(45) Date of Patent: Aug. 17, 2021

(54) SEMICONDUCTOR CHIP MANUFACTURING PROCESS FOR INTEGRATING LOGIC CIRCUITRY, EMBEDDED DRAM AND EMBEDDED NON-VOLATILE FERROELECTRIC RANDOM ACCESS MEMORY (FERAM) ON A SAME SEMICONDUCTOR DIE

(71) Applicant: Intel Corporation, Santa Clara, CA (US)

(72) Inventors: Ilya Karpov, Portland, OR (US); Yih Wang, Portland, OR (US); Fatih Hamzaoglu, Portland, OR (US); James Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 16/319,239

(22) PCT Filed: Sep. 30, 2016

(86) PCT No.: PCT/US2016/054918
§ 371 (c)(1),
(2) Date: Jan. 18, 2019

(87) PCT Pub. No.: WO2018/063375
PCT Pub. Date: Apr. 5, 2018

(65) Prior Publication Data
US 2019/0279697 A1 Sep. 12, 2019

(51) Int. Cl.
*H01L 21/02* (2006.01)
*G11C 11/00* (2006.01)
(Continued)

(52) U.S. Cl.
CPC .......... *G11C 11/005* (2013.01); *G11C 11/221* (2013.01); *G11C 11/2259* (2013.01);
(Continued)

(58) Field of Classification Search
CPC .......... H01L 27/10814; H01L 27/11507; H01L 27/11514; H01L 27/108; H01L 27/11502;
(Continued)

(56) References Cited

U.S. PATENT DOCUMENTS

| | | |
|---|---|---|
| 6,259,126 B1 | 7/2001 | Hsu et al. |
| 2007/0252185 A1 | 11/2007 | Kang |

(Continued)

FOREIGN PATENT DOCUMENTS

KR 10-2015-0091892 8/2015

OTHER PUBLICATIONS

International Search Report and Written Opinion for International Patent Application No. PCT/US2016/054918 dated Jun. 29, 2017, 13 pgs.

*Primary Examiner* — Brook Kebede
(74) *Attorney, Agent, or Firm* — Schwabe, Williamson & Wyatt, P.C.

(57) ABSTRACT

An apparatus is described. The apparatus includes a semiconductor chip that includes logic circuitry, embedded dynamic random access memory (DRAM) cells and embedded ferroelectric random access memory (FeRAM) cells.

20 Claims, 19 Drawing Sheets

(51) Int. Cl.
  *G11C 11/22* (2006.01)
  *G11C 11/407* (2006.01)
  *H01L 27/108* (2006.01)
  *H01L 27/11514* (2017.01)
  *H01L 27/11507* (2017.01)
  *G11C 11/401* (2006.01)

(52) U.S. Cl.
  CPC ...... *G11C 11/407* (2013.01); *H01L 27/10814* (2013.01); *H01L 27/11507* (2013.01); *H01L 27/11514* (2013.01); *G11C 11/22* (2013.01); *G11C 11/401* (2013.01); *G11C 2213/71* (2013.01)

(58) Field of Classification Search
  CPC . G11C 11/005; G11C 11/221; G11C 11/2259; G11C 11/407; G11C 2211/561; G06F 12/0842; G06F 13/4234
  See application file for complete search history.

(56) References Cited

U.S. PATENT DOCUMENTS

| | | |
|---|---|---|
| 2014/0021584 A1 | 1/2014 | Tu et al. |
| 2015/0143037 A1* | 5/2015 | Smith .................. G06F 3/0659 711/103 |
| 2015/0179608 A1* | 6/2015 | Sung ...................... H01L 25/03 257/774 |
| 2015/0340366 A1 | 11/2015 | Lim et al. |

* cited by examiner

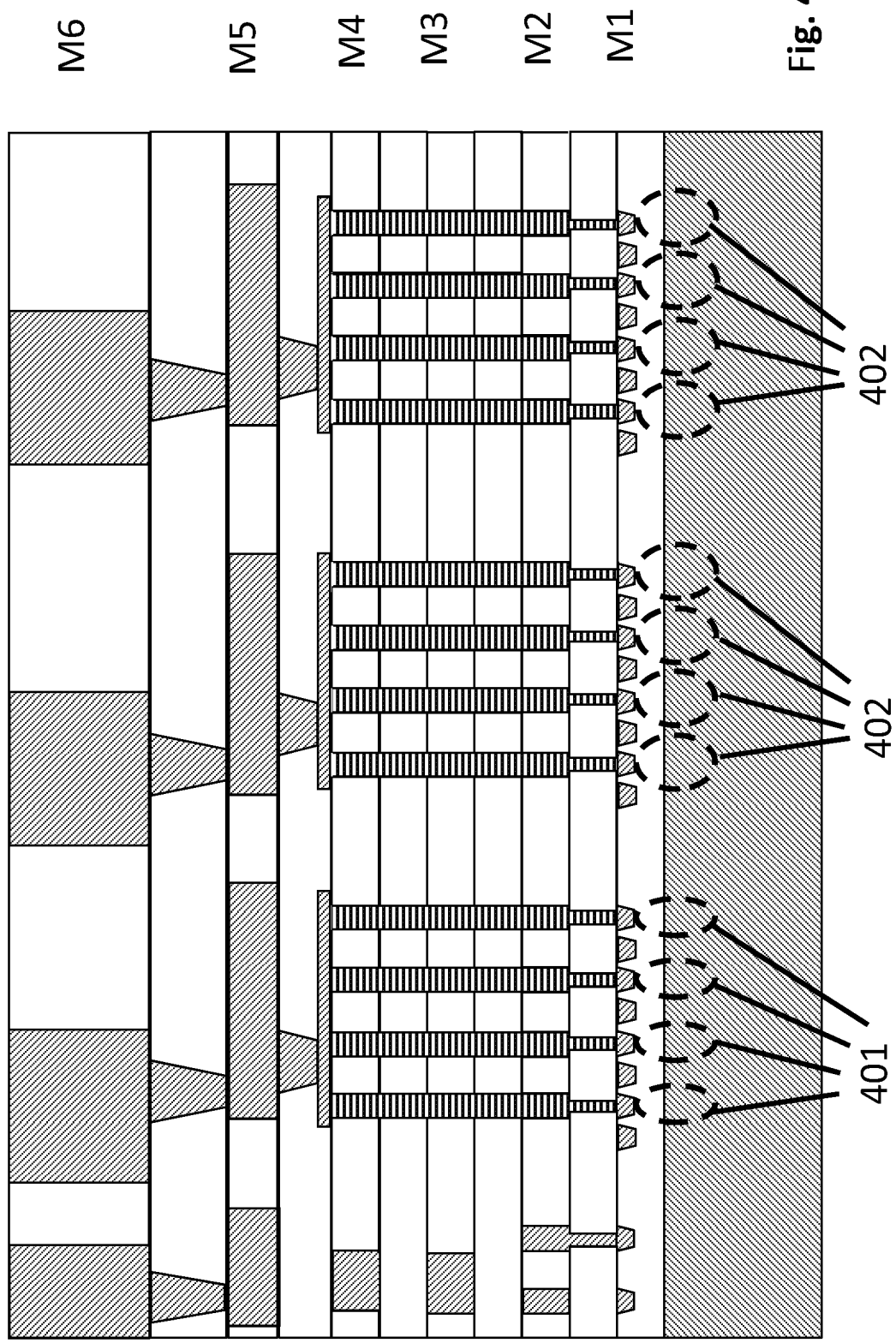

SEMICONDUCTOR CHIP MANUFACTURING PROCESS FOR INTEGRATING LOGIC CIRCUITRY, EMBEDDED DRAM AND EMBEDDED NON-VOLATILE FERROELECTRIC RANDOM ACCESS MEMORY (FERAM) ON A SAME SEMICONDUCTOR DIE

CROSS-REFERENCE TO RELATED APPLICATION

This patent application is a U.S. National Phase Application under 35 U.S.C. § 371 of International Application No. PCT/US2016/054918, filed Sep. 30, 2016, entitled "SEMICONDUCTOR CHIP MANUFACTURING PROCESS FOR INTEGRATING LOGIC CIRCUITRY, EMBEDDED DRAM AND EMBEDDED NON-VOLATILE FERROELECTRIC RANDOM ACCESS MEMORY (FERAM) ON A SAME SEMICONDUCTOR DIE," which designates the United States of America, the entire disclosure of which is hereby incorporated by reference in its entirety and for all purposes.

FIELD OF INVENTION

The field of invention pertains generally to the computing sciences, and, more specifically, to a semiconductor chip manufacturing process for integrating logic circuitry, embedded DRAM and embedded non-volatile ferroelectric random access memory (FeRAM) on a same semiconductor die.

BACKGROUND

Computing systems typically include a system memory (or main memory) that contains data and program code of the software code that the system's processor(s) are currently executing. A pertinent issue in many computer systems is the system memory. Here, as is understood in the art, a computing system operates by executing program code stored in system memory. The program code when executed reads and writes data from/to system memory. As such, system memory is heavily utilized with many program codes and data reads as well as many data writes over the course of the computing system's operation. Finding ways to improve system memory is therefore a motivation of computing system engineers.

FIGURES

Figure 1A:
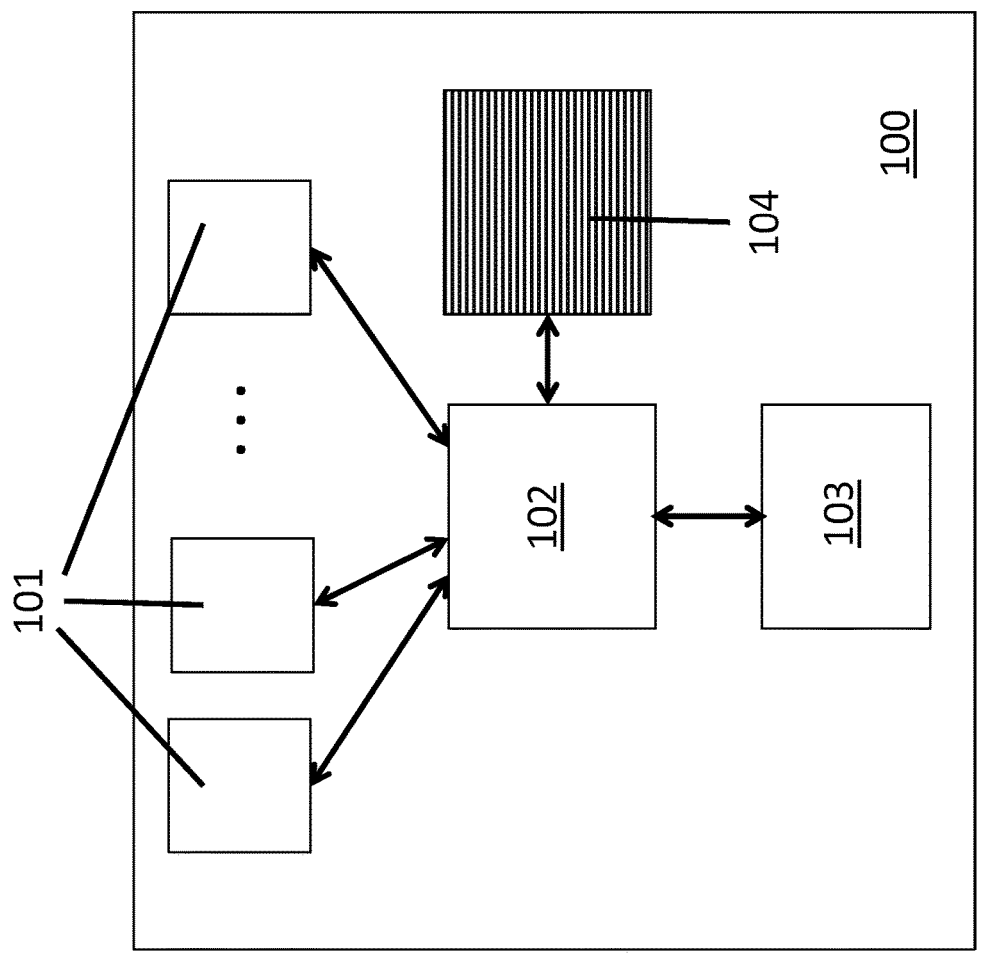
Figure 1B:
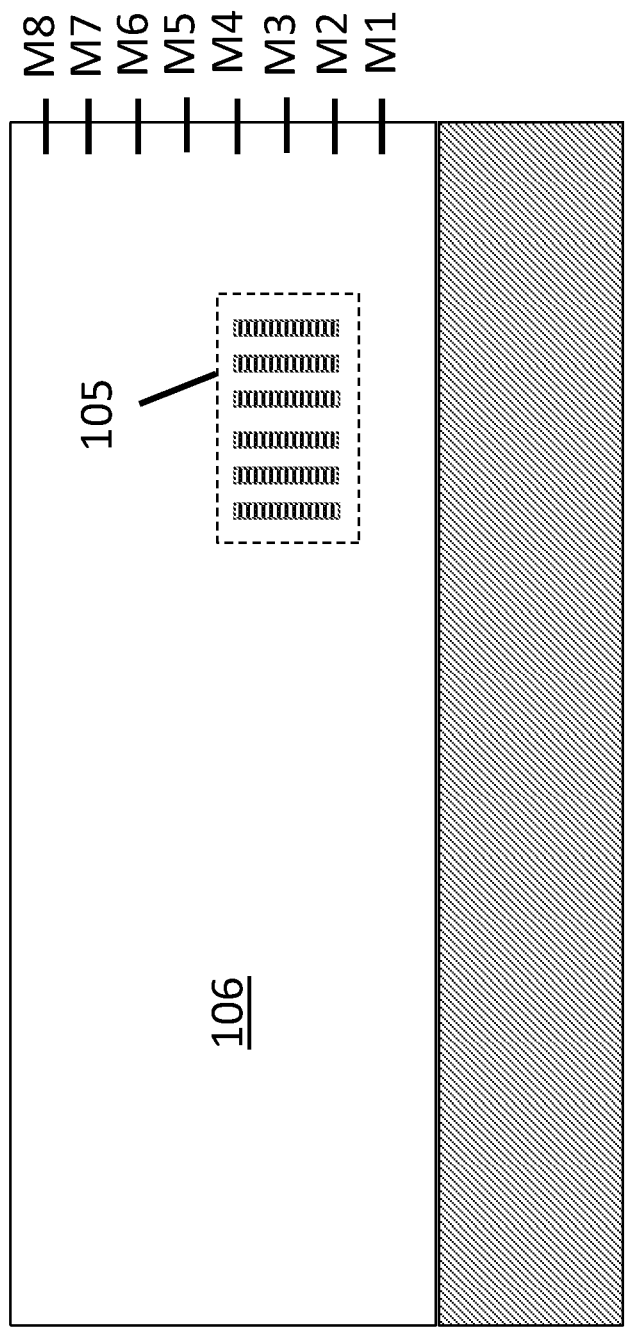
Figure 2A:
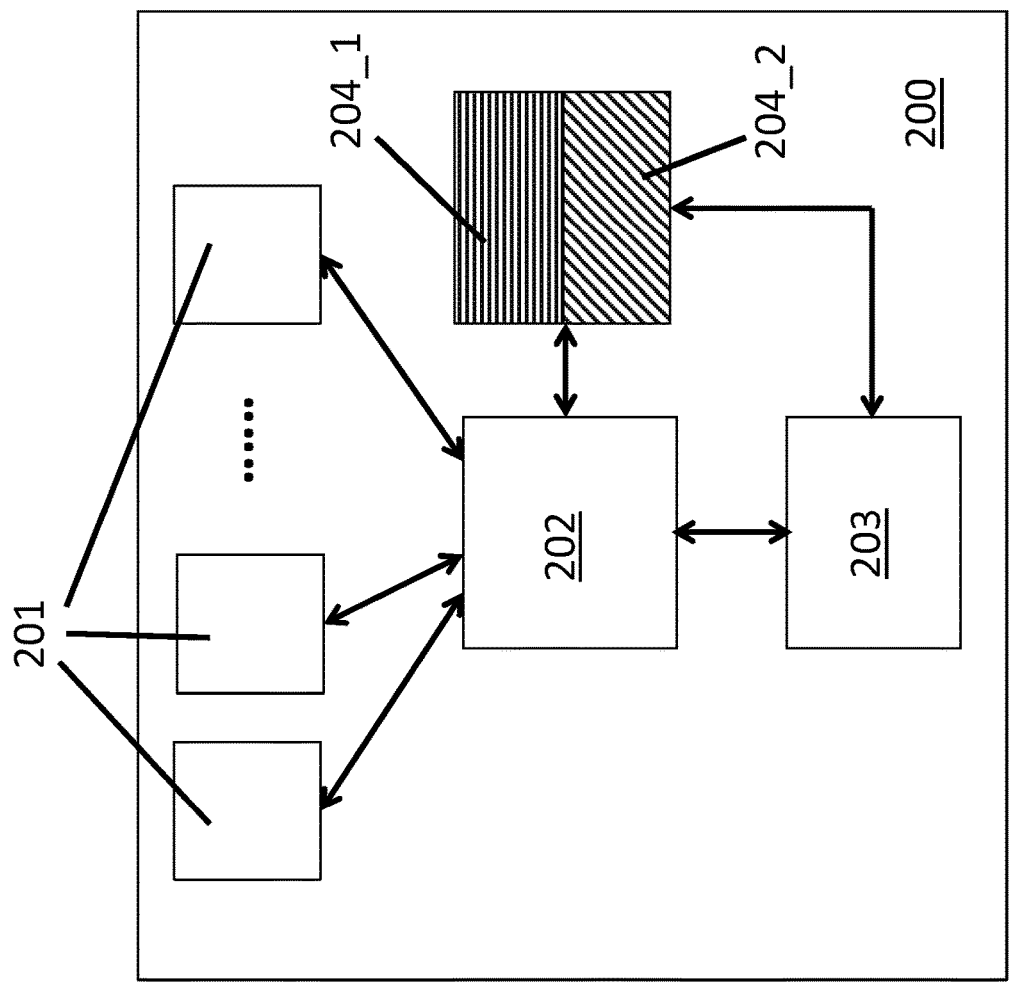
Figure 2B:
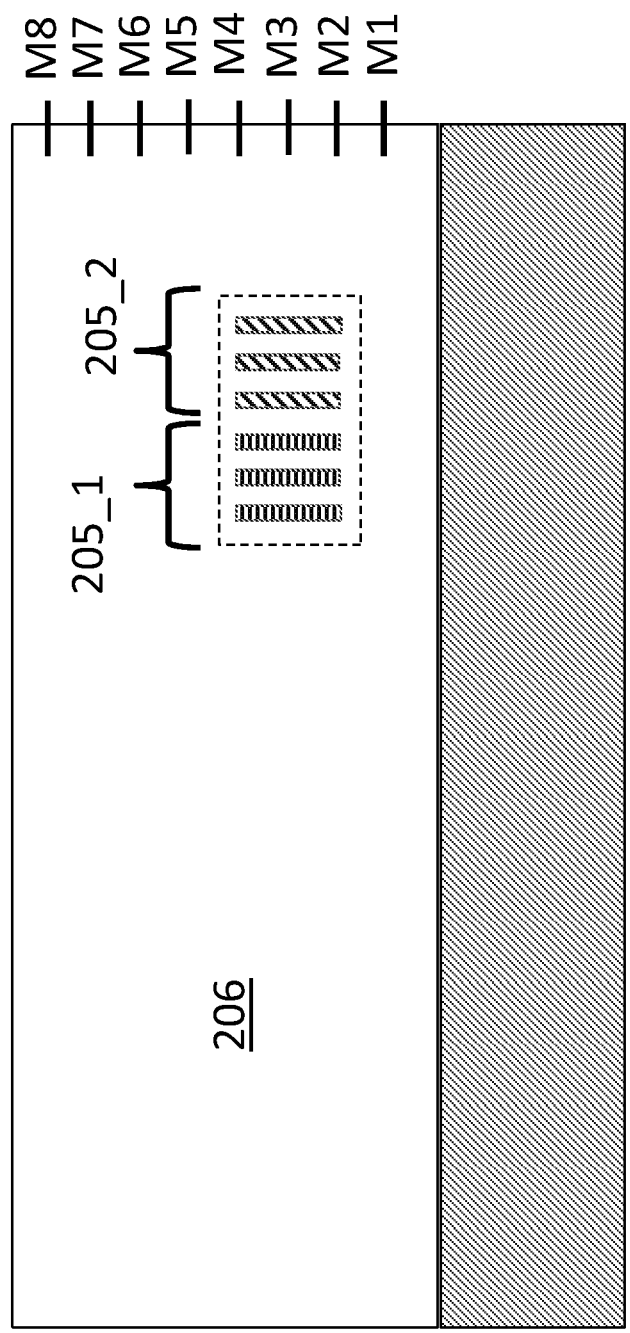
Figure 4B:
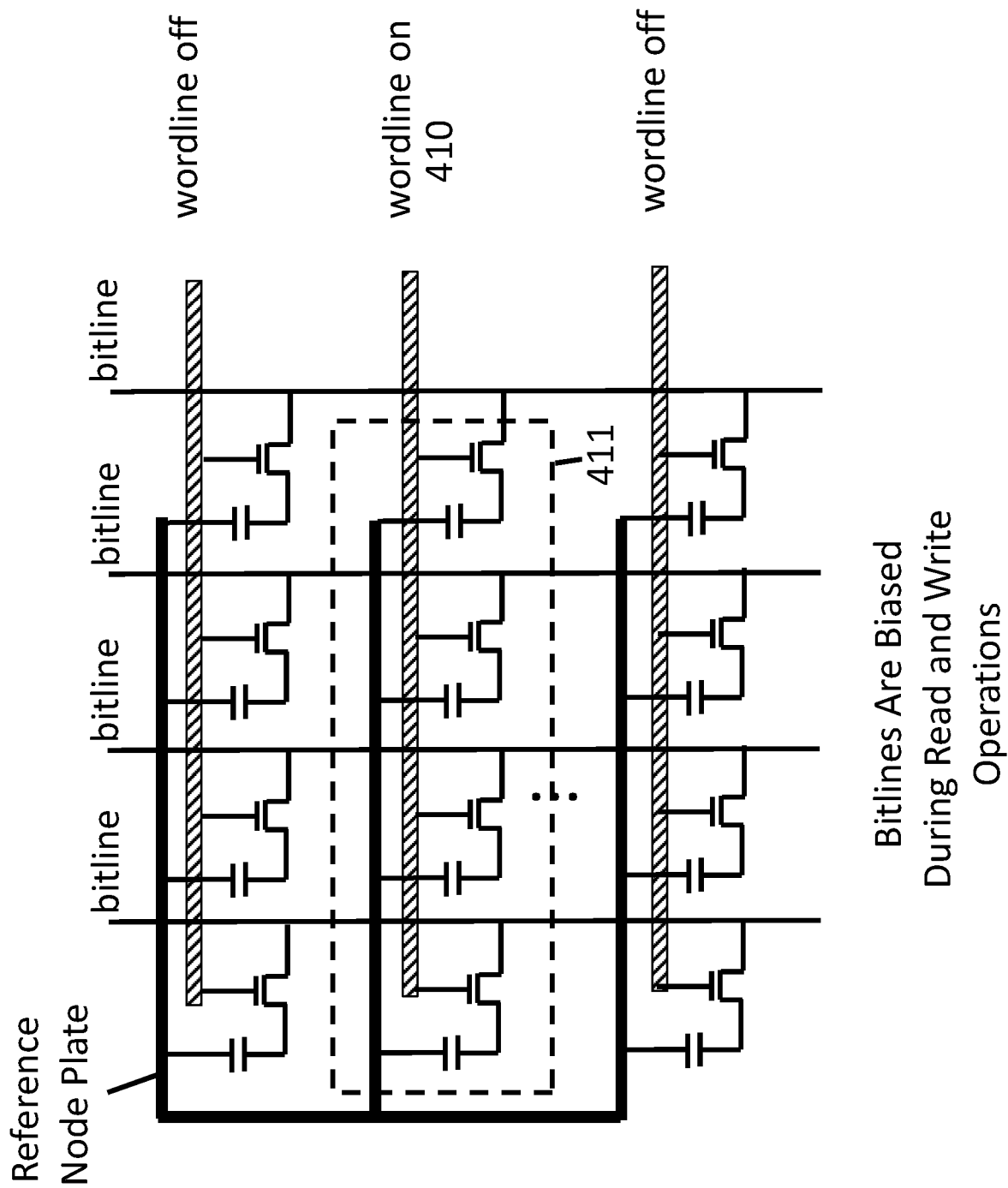
Figure 4C:
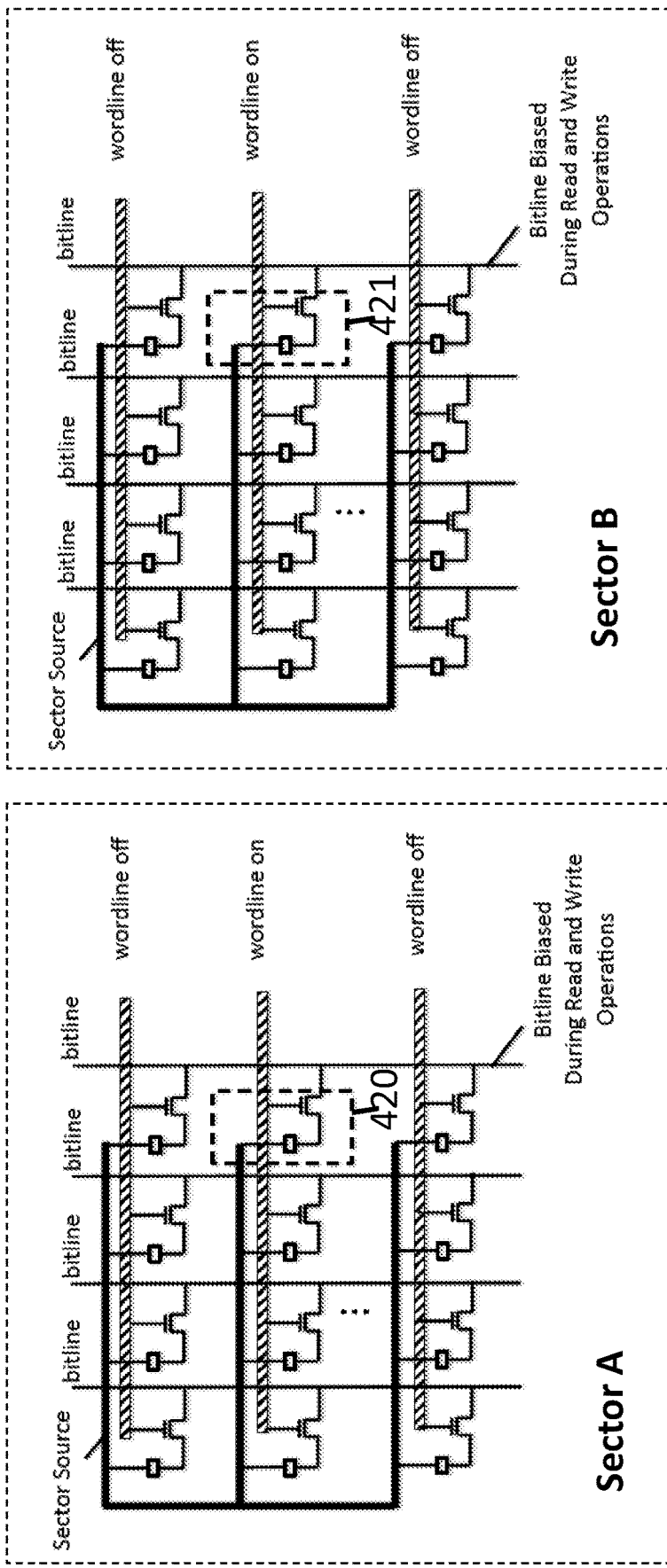
Figure 5:
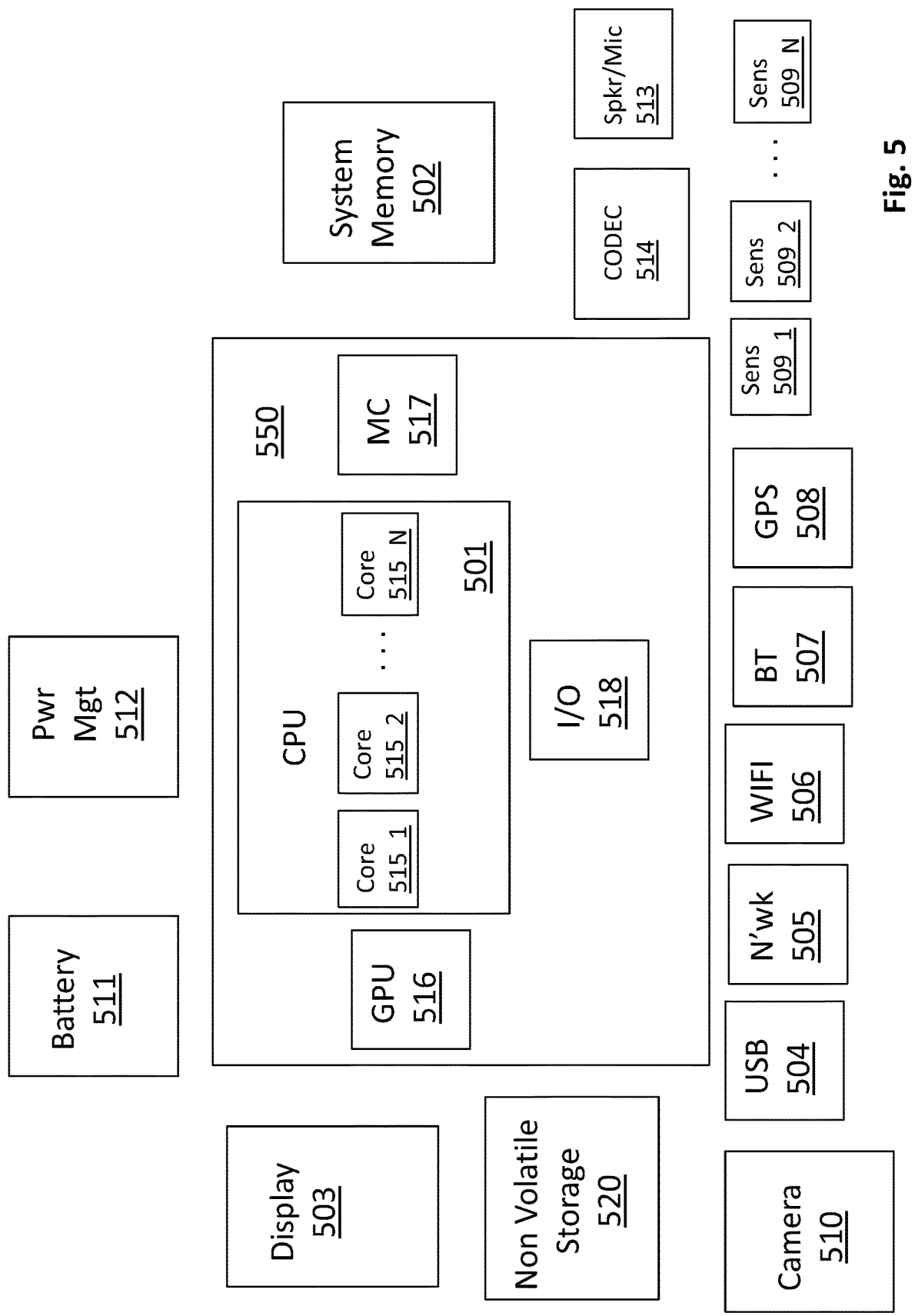

A better understanding of the present invention can be obtained from the following detailed description in conjunction with the following drawings, in which:

FIGS. 1a and 1b pertain to a prior art system on chip;

FIGS. 2a and 2b pertain to an improved system on chip;

FIGS. 3a through 3k show a manufacturing process for manufacturing the improved system on chip of FIGS. 2a and 2b;

FIGS. 4a through 4c pertain to accessing details for a system on chip having embedded DRAM and embedded FeRAM cells;

FIG. 5 shows a computing system.

DETAILED DESCRIPTION

FIG. 1a shows a computing system 100 that includes a plurality of processing cores 101 coupled to a memory controller 102. The memory controller 102 is coupled to a peripheral control hub 103 and a system memory 104. Owing to the cost reductions associated with manufacturing integration, device and system designers prefer to use technologies in which as many system components as possible are monolithically integrated on a same semiconductor die.

Over the past decade or so, "system on chip" devices that integrate the processing cores 101, memory controller 102 and peripheral control 103 hub on a same semiconductor chip have become commonplace. Historically though, monolithic integration of system memory 104, composed of dynamic random access memory (DRAM) cells on the same semiconductor die as the logic used to implement the cores 101 and controllers 102, 103 has been problematic.

Recently, however, new efforts have been made to monolithically integrate DRAM cells onto the same die as the logic circuitry. FIG. 1b shows one embedded DRAM approach in which the capacitors used to implement the respective DRAM cells are manufactured as metal-insulator-metal (MIM) capacitors 105 within the interconnect metallurgy 106 of the semiconductor die. Here, FIG. 1b shows the DRAM MIM capacitors 105 extending approximately between the fourth layer of metallization (M4) and the second layer of metallization (M2).

From an architectural perspective there can also be justifications for implementing a multi-level system memory. In the case of a multi-level system memory, for example, faster DRAM cells act as a faster, higher priority region of system memory and slower, emerging non volatile memory cells (e.g., ferroelectric random access memory (FeRAM) cells) act as a slower, lower priority region of system memory. For example, faster DRAM cells may be implemented as a memory side cache for the emerging non volatile memory cells (in which case system memory addresses are assigned primarily to the non volatile memory cells), and/or, the DRAM cells may be allocated their own respective, separate system memory address space so that they behave as a truly higher priority region of system memory.

FIG. 2a shows a possible system on chip in which a multi-level system memory composed of different memory cell technologies, e.g., DRAM 204_1 and FeRAM 204_2, are monolithically integrated onto the same semiconductor die 200 as the processing cores 201, memory controller 202 and peripheral controller 203. As depicted, the non volatile FeRAM cells 204_2 can be coupled to the main memory controller 202 as, e.g., a (lower) level of system memory that is integrated on the die 200. Alternatively or in combination, the FeRAM cells 204_2 may be coupled to the peripheral controller 203, e.g., to effect deeper mass storage (such as an embedded solid state disk) that is monolithically integrated on the die 200. FIG. 2b depicts integration of both MIM capacitor DRAM cells 205_1 and emerging non volatile memory FeRAM cells 205_2 in the interconnect metallurgy 206 of the semiconductor die.

FIGS. 3a through 3k shows a manufacturing process sequence capable of integrating logic circuitry, DRAM cells and FeRAM cells on a same semiconductor die.

Figure 3A:
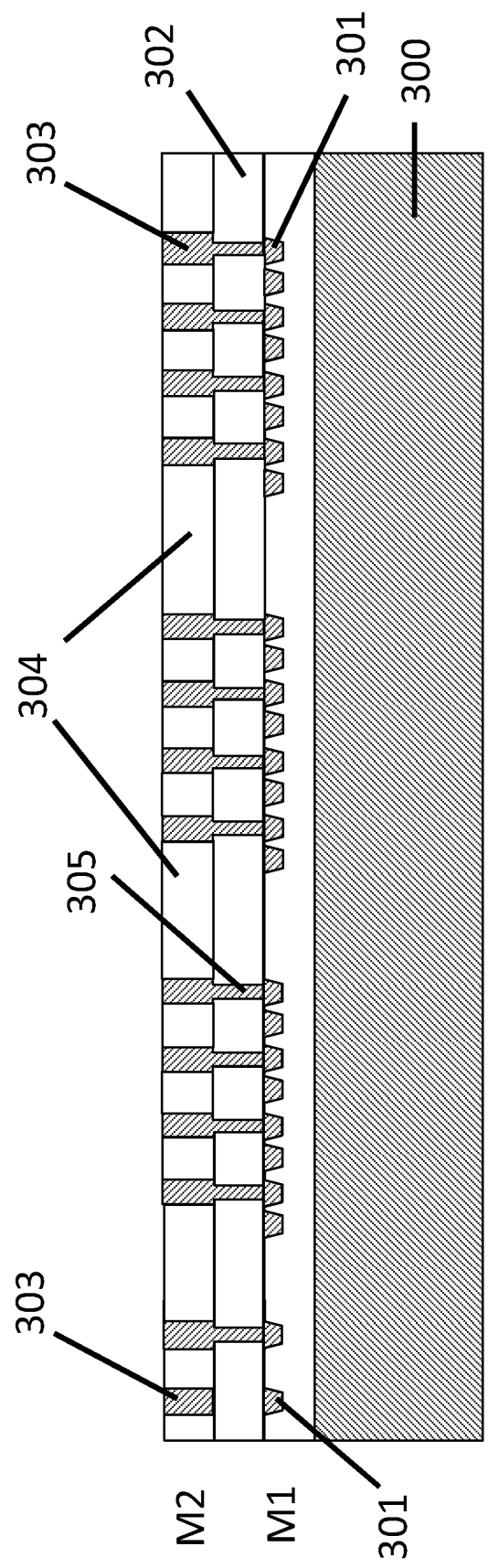

FIG. 3a shows the manufactured structure after the polishing of the second level metal 303 (M2) to the surface of the second metal level dielectric 304. In an embodiment, a damascene process is used to form the M2 (and M1) metal layers. That is, the M2 level dielectric 304 is first deposited on the M2/M1 interlayer dielectric 303. In various embodiments, both interlayer 302 and metal level 304 dielectrics are formed of a low-k carbon doped oxide (CDO).

After deposition of the M2 level dielectric 304, it is patterned according to a photolithographic process that forms openings in the dielectric where M2 layer metal structures are to be formed. Then, a barrier layer (e.g., Tantalum (Ta), Titanium (Ti), Titanium Nitride (TiN), Tantalum Nitride (TaN)), not shown in FIG. 3a for simplicity, is disposed over the M2 dielectric 304 so as to fill the aforementioned openings. Here, the aforementioned barrier layer prevents diffusion of the (yet to formed) copper metal structures from diffusing into any surrounding dielectric.

Then, copper M2 metal structures 303 are formed by electroplating copper on the barrier layer. In an embodiment, a copper seed layer is first deposited on the barrier layer (e.g., by a physical vapor deposition process such as sputter deposition). Then the M2 copper layer is deposited on the seed layer by electroplating. Here, the thickness of the M2 copper should be sufficient to fill the openings in the M2 dielectric 304 and form a copper layer over the upper surface of the M2 dielectric 304. The copper is then polished using a chemical mechanical polishing (CMP) process until the surface of the M2 dielectric 304 is reached.

An M1 metal layer with specific M1 metal features 301 resides beneath the M2 layer. Active transistor devices (such as FINFETs) reside beneath the M1 layer in/on the semiconductor substrate 300. Certain ones of the M1 features 301 are electrically connected with contacts to the devices through vias that extend from the M1 layer to the contacts which are disposed on or just above the semiconductor surface 300. For ease of drawing, the transistor devices, their contacts and the associated vias have not been drawn. Vias 305 are shown, however, between the M2 and M1 metal layers.

Figure 3B:
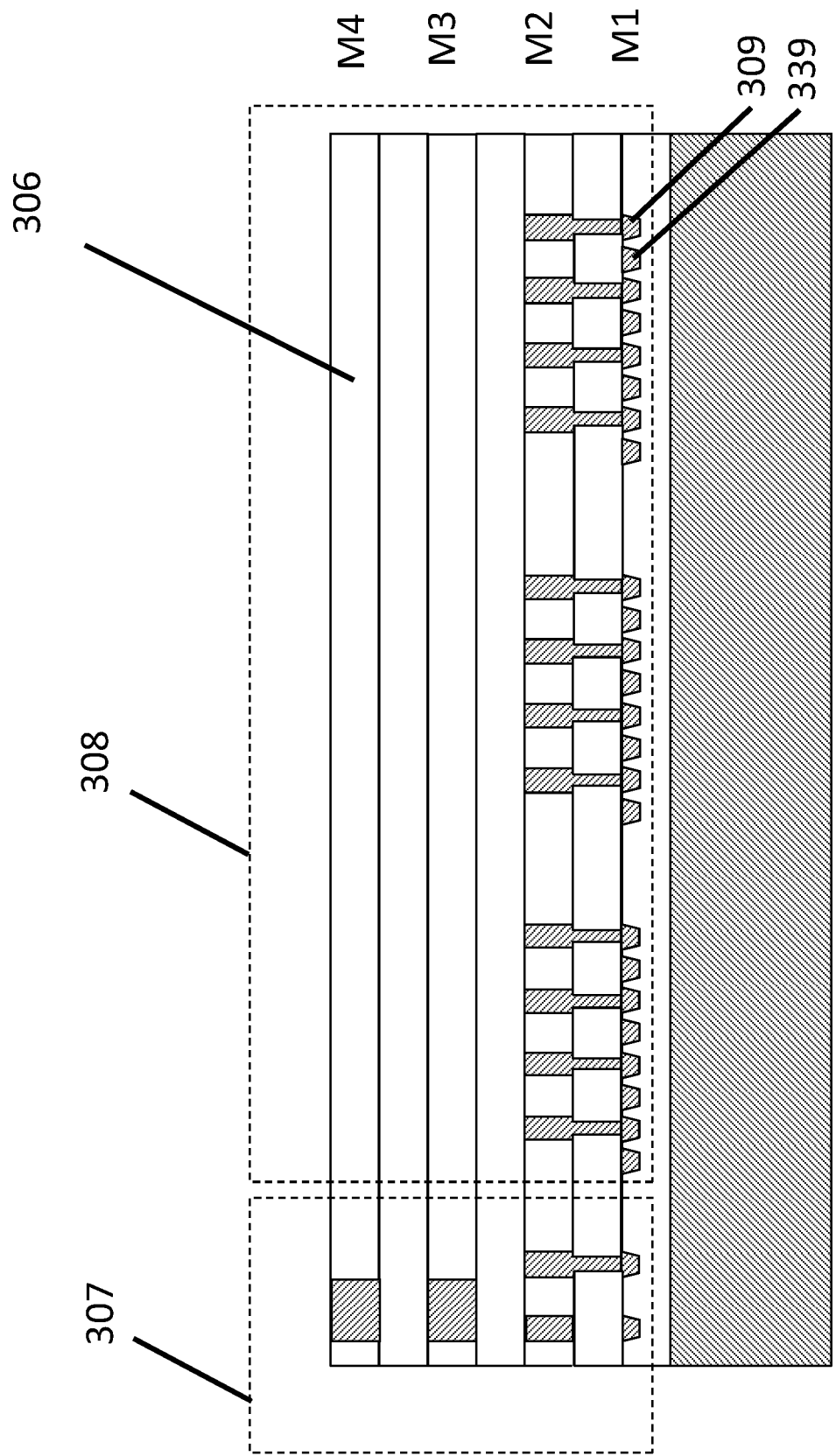

After the formation of the M2 layer, as observed in FIG. 3b, the M3 layer is formed, an M3/M4 interlayer dielectric layer is formed on the M3 layer and the M4 dielectric layer 306 is formed on the M3/M4 interlayer dielectric. In an embodiment, like the M1 and M2 layers beneath them, the M3, M4 and higher metal layers are also composed of copper and patterned according to a damascene process. Here, notably, region 307 corresponds to logic interconnect, whereas, as will be explained more thoroughly below, region 308 corresponds to regions where both embedded DRAM and embedded FERAM memory cells will be formed.

FIGS. 3c through 3i depict formation of both DRAM and FeRAM memory cell structures in the M4 through M2 interconnect. Here, as will be more apparent in the following discussion, referring briefly back to FIG. 3b, pairs of M1 metal features 309, 329 in region 308 reside beneath each storage cell to be formed in region 308. More specifically, as will be explained in more detail further below, each storage cell to be formed in region 308 has an access transistor M1 feature 309 and a bitline M1 feature (for ease of drawing, only the M1 feature pair 309, 339 have been labeled in FIG. 3b with respect to the rightmost storage cell location. As is understood in the art, generally, storage cells have individual supporting circuit structures that include an access transistor and a bitline. Feature 309 corresponds to the connection to the access transistor for the rightmost storage cell of FIG. 3b and feature 339 corresponds to the bitline that the rightmost storage cell of FIG. 3b will be coupled to. Metal features formed at the M4 level in region 308 will correspond to the top electrode of the memory cells.

Figure 3C:
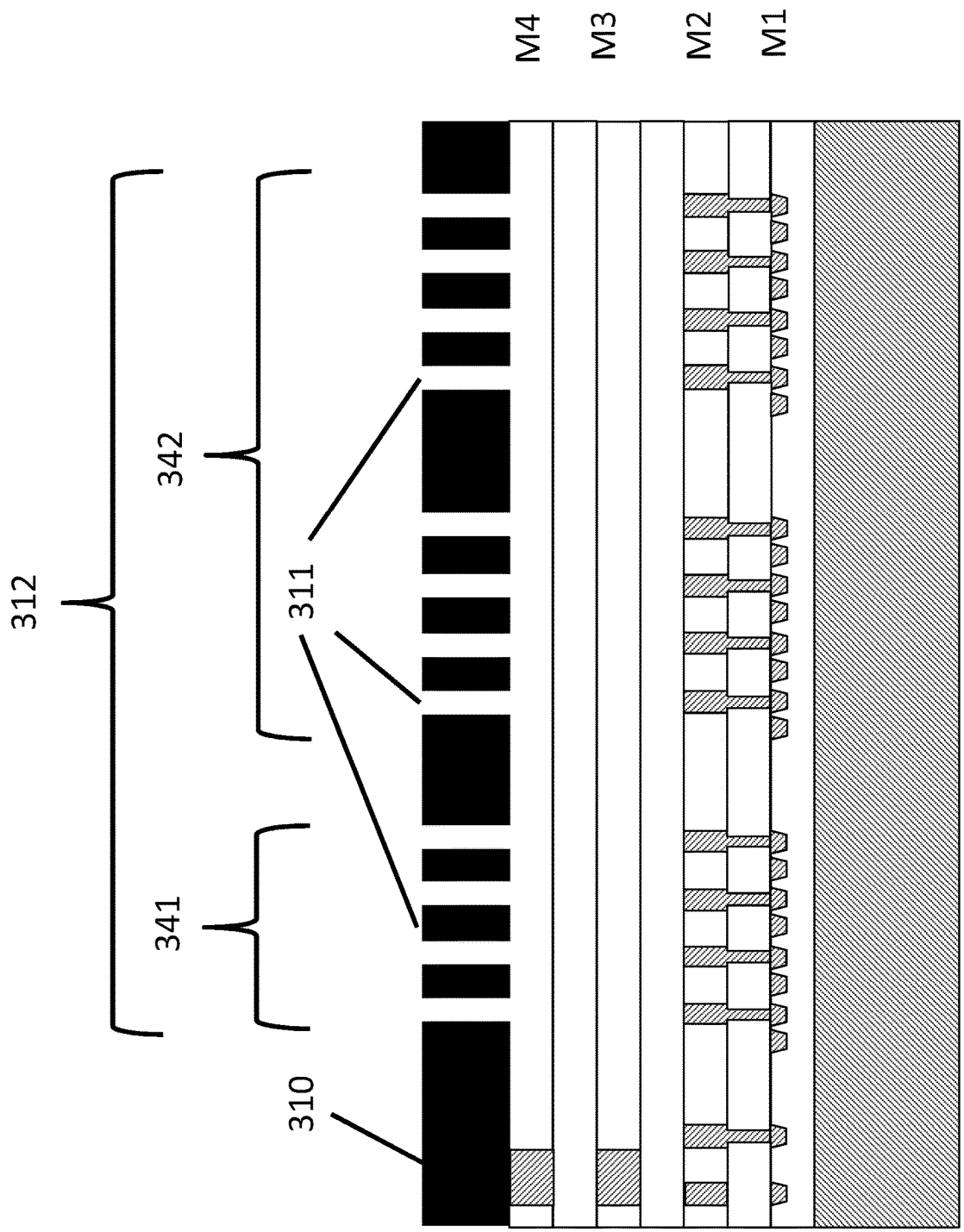

As observed in FIG. 3c, a layer of photoresist 310 is deposited on the structure of FIG. 3b and patterned by way of the photolithographic techniques so as to expose openings 311 in a region 312 where DRAM and FeRAM cells are to be formed. Here, as will be described more thoroughly below, in an embodiment, the physical structure of the DRAM cells and the FeRAM cells are the same. Thus, they can be simultaneously formed according to a same manufacturing process. However, the circuit designs that are coupled to the same physical storage cells are different depending on whether the storage cell is to behave as a DRAM cell or an FeRAM cell. As such, region 312 which embraces both kinds of cells can be further broken into a first region 341 where the cells will be implemented as DRAM cells and a second region 342 where the cells will be implemented as FeRAM cells.

Figure 3D:
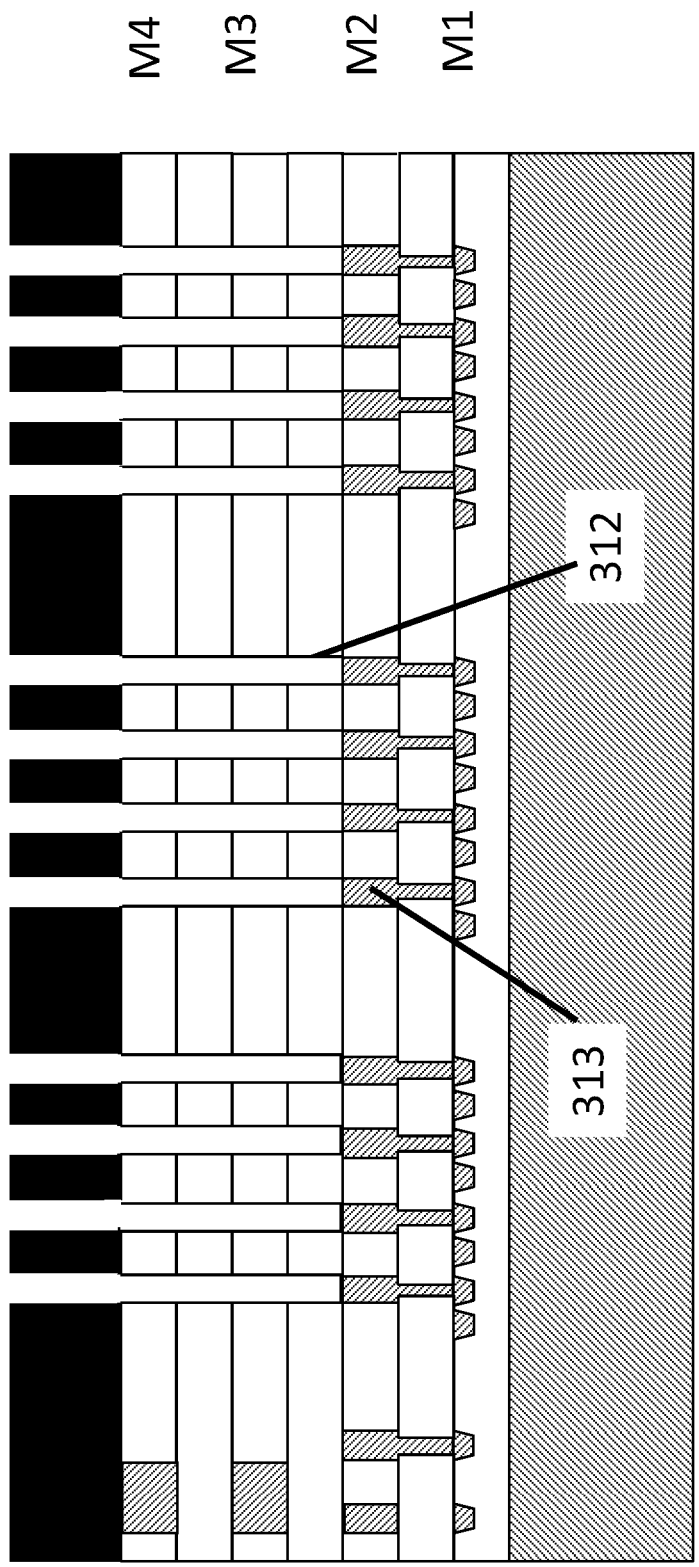

As observed in FIG. 3d, trenches 312 are etched with an anisotropic dry etch process through the M4 through M2 dielectrics so as to expose the top surfaces of the underlying M2 metal structures 313. Here, the anisotropic etching process etches the dielectrics in a substantially vertical direction but not a substantially lateral direction so that high aspect ratio vias are formed. In various embodiments, a dry plasma etch is used to remove dielectric material from the exposed area of patterned region in 312. Underlying M2 copper 313 is then selectively etched. In an embodiment, the trenches 312 are approximately 300-500 nm high and about 100 nm wide.

Figure 3E:
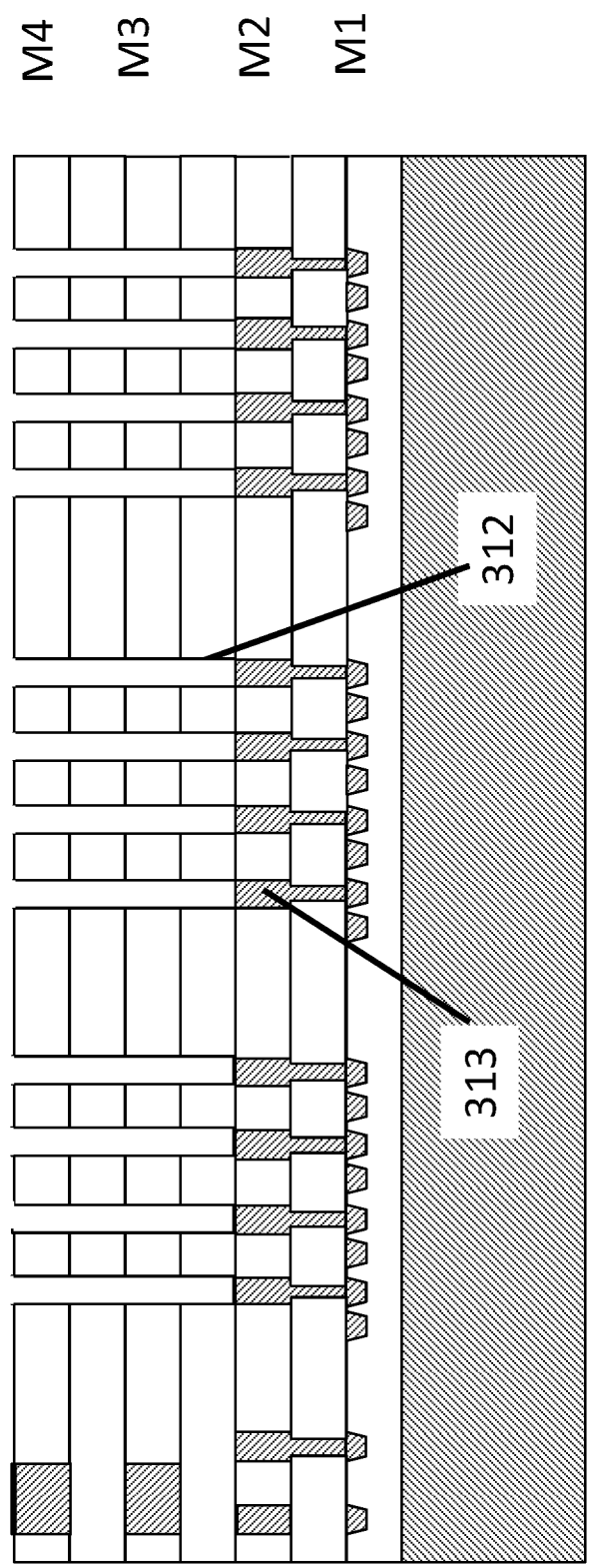
Figure 3F:
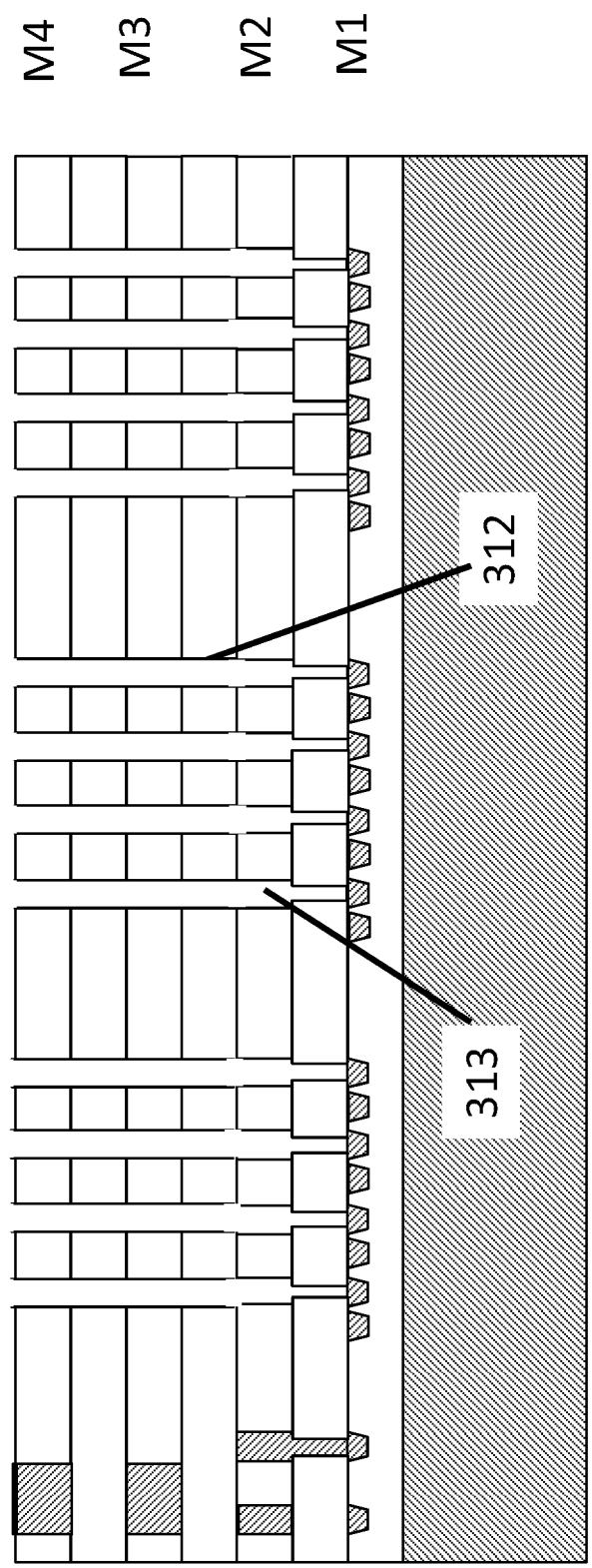

As observed in FIG. 3e, the photoresist 310 is removed to expose the wafer surface and the openings 312 that were just formed in the interconnect layering. As observed in FIG. 3f, the exposed underlying M2 structures and the M2/M1 vias beneath them are removed by a wet etch that is selective to copper. That is, the ambient of the etch process contains reactants that chemically react with copper but not with dielectric. As such, the copper is gradually eroded. In an embodiment, the top surface of the M1 metal structures 309 have an etch stop metal that does not react with the chemical etch which causes the etch to cease at the top of the M1 metal. In an embodiment, the M2 metal and M2/M1 vias are not removed and the etching of the openings is designed to stop at the top of the M2 metal.

Figure 3G:
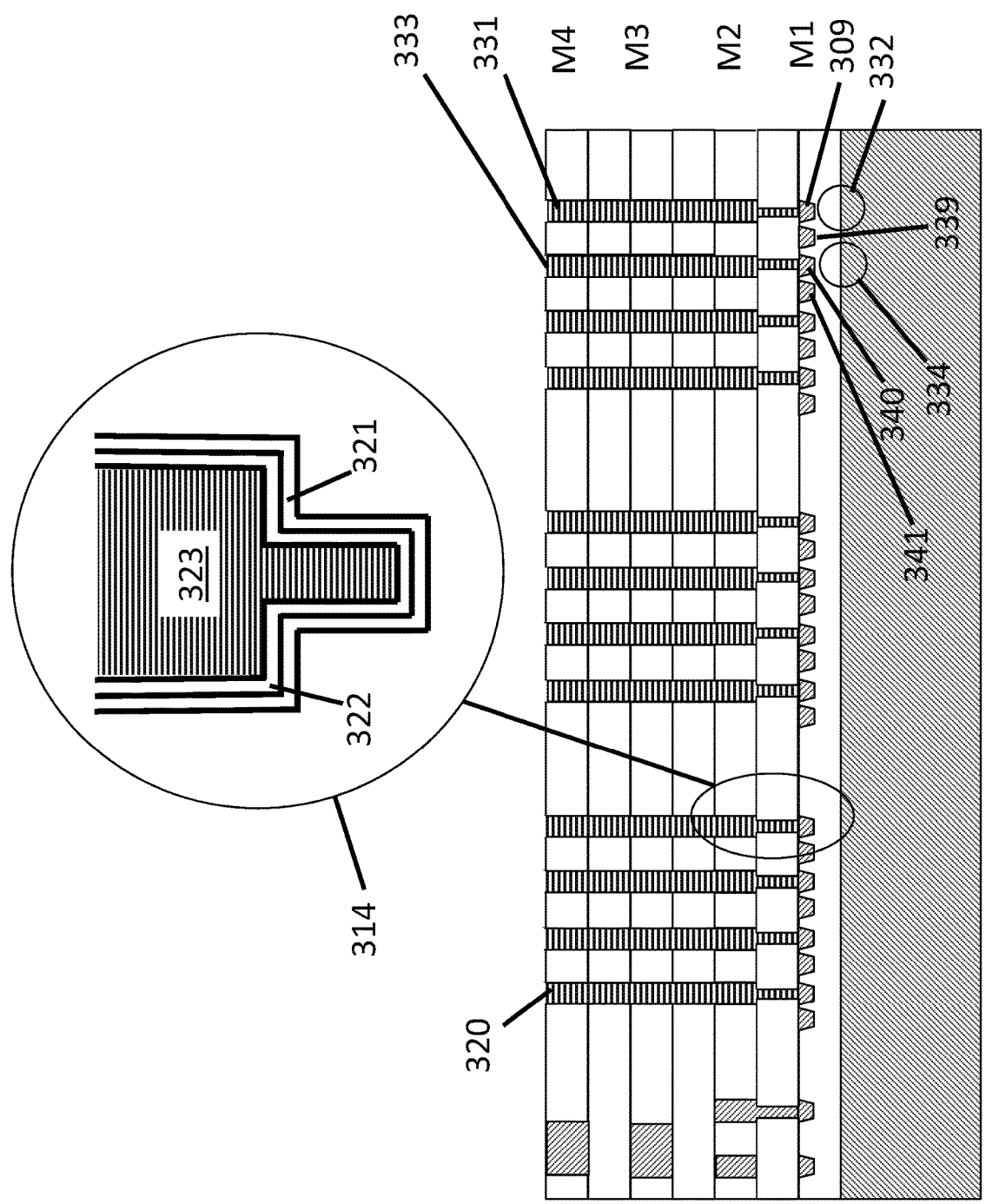

As observed in FIG. 3g, the material stack 314 for both a DRAM cell and an FeRAM cell is sequentially deposited onto the wafer in a manner that fills the trenches 312 to form respective DRAM or FeRAM cells from respective metal-insulator-metal (MIM) like structures. Recall from above that in various embodiments the storage cells are manufactured identically but how they are used by their respective surrounding circuitry is different depending on whether the cells are to be used as a DRAM cell or an FeRAM cell.

More specifically, DRAM accessing circuitry is designed to treat its storage cells as capacitors that store charge provided to them whereas FeRAM accessing circuitry is designed to set the electric dipole moment of its storage cells in a particular direction. That is, DRAM write circuitry is designed to place charge or not place charge into a cell depending on whether a 1 or 0 is being written to the cell. Likewise, DRAM read circuitry is designed to sense whether a cell is storing sufficient charge or not to be interpreted as storing a 1 or 0.

By contrast, FeRAM write circuitry is designed to write a current in a particular direction (e.g., up or down) or apply a voltage of a particular polarity to the cell depending on whether a 1 or 0 is being written to the cell in order to set the electric dipole moment of the cell in a particular direction (e.g., up or down). Likewise, FeRAM read cell circuitry is designed to sense which direction the electric dipole moment is pointing.

Note also that in an approach where the DRAM cells are manufactured the same as the FeRAM cells or otherwise contain a dielectric that exhibits ferro-electric properties (a propensity to keep its electric dipole moment), such as doped Hafnium Oxide, the DRAM cells are apt to hold onto their charge better than a standard DRAM cell and therefore should be able to operate with a lower frequency refresh rate. As such, the DRAM cells may be able to operate with less power consumption than standard DRAM cells.

As observed in FIG. 3g, the material stack 314 that is formed in the open vias includes a lower electrode 321, a ferroelectric material 322 and a top electrode 323. In various embodiments, the lower electrode 321 is composed of an inert electrode such as TiN or TaN or Ru; the ferroelectric material 322 is composed of doped hafnium oxide (HfO) and the top electrode 323 is composed of TiN, TaN or Ru. Here, a dopant applied to the ferroelectric material 322 (e.g., hafnium oxide) induces the ferroelectric material 322 to behave in a ferroelectric manner.

In an embodiment, the ferroelectric material 322 is deposited by atomic layer deposition (ALD) and has a thickness of 5-10 nm. The materials for the electrodes 321, 323 may also be a multi-layer structure that are composed of an "inner layer" composed of an inert barrier layer that is in contact with the ferroelectric layer 322 and a thicker "outer layer" composed of a metal electrode. The metal electrodes (e.g., TiN or TaN or Ru) can be deposited by an atomic layer deposition with thickness as low as 3 nm for the lower electrode 321.

As is known in the art, each individual storage cell in a memory has associated circuitry that permits the reading/writing of a bit of information from/to the cell. Each cell therefore has an associated access transistor that, with proper control, permits access to its particular cell. A pertinent feature of the FeRAM design of FIG. 3g (described in more detail further below with respect to FIGS. 4a through 4c) is that the access transistor for an FeRAM cell resides directly beneath the cell. That is, for example, the access transistor for FeRAM cell 331 resides in/on region 332 of the substrate directly beneath cell 331, and, the access transistor for FeRAM cell 333 resides in/on region 334 of the substrate directly beneath cell 333. Here again, recalling the discussion of M1 features 309 and 339 with respect to FIG. 3b, note that M1 feature 309 is connected to a contact of access transistor 332 and M1 feature 340 is connected to a contact of access transistor 334. Additionally, also as described above with respect to FIG. 3b, the respective bitline that each storage cell is coupled to resides beneath its respective cell. For example, feature 339 corresponds to the bitline for the rightmost storage cell 331 and feature 341 corresponds to the bitline for the second to rightmost storage cell 333. The respective access transistors and bitlines for the other FeRAM cells are similarly located.

In an embodiment, the DRAM memory is designed similarly to the FeRAM memory in that the access transistor for a particular DRAM cell and a bitline for the DRAM cell reside beneath the cell. As such, a capacitor-over-bitline (COB) design approach is adopted. As is known in the art, in a COB approach, a DRAM storage cell is directly connected to its access transistor, where, the access transistor resides directly beneath the DRAM cell in/on the semiconductor substrate. The access transistor itself is directly connected to the DRAM cell's bitline and wordline. For example, a gate of the access transistor is connected to the cell's word line, one S/D terminal of the access transistor is connected to the cell's bit line and another S/D terminal of the access transistor is connected to the bottom electrode of the cell. Here, again, the bit line (and even the word line) are formed from M1 metal. As discussed at length above, the FeRAM cells may be similarly designed.

Figure 3H:
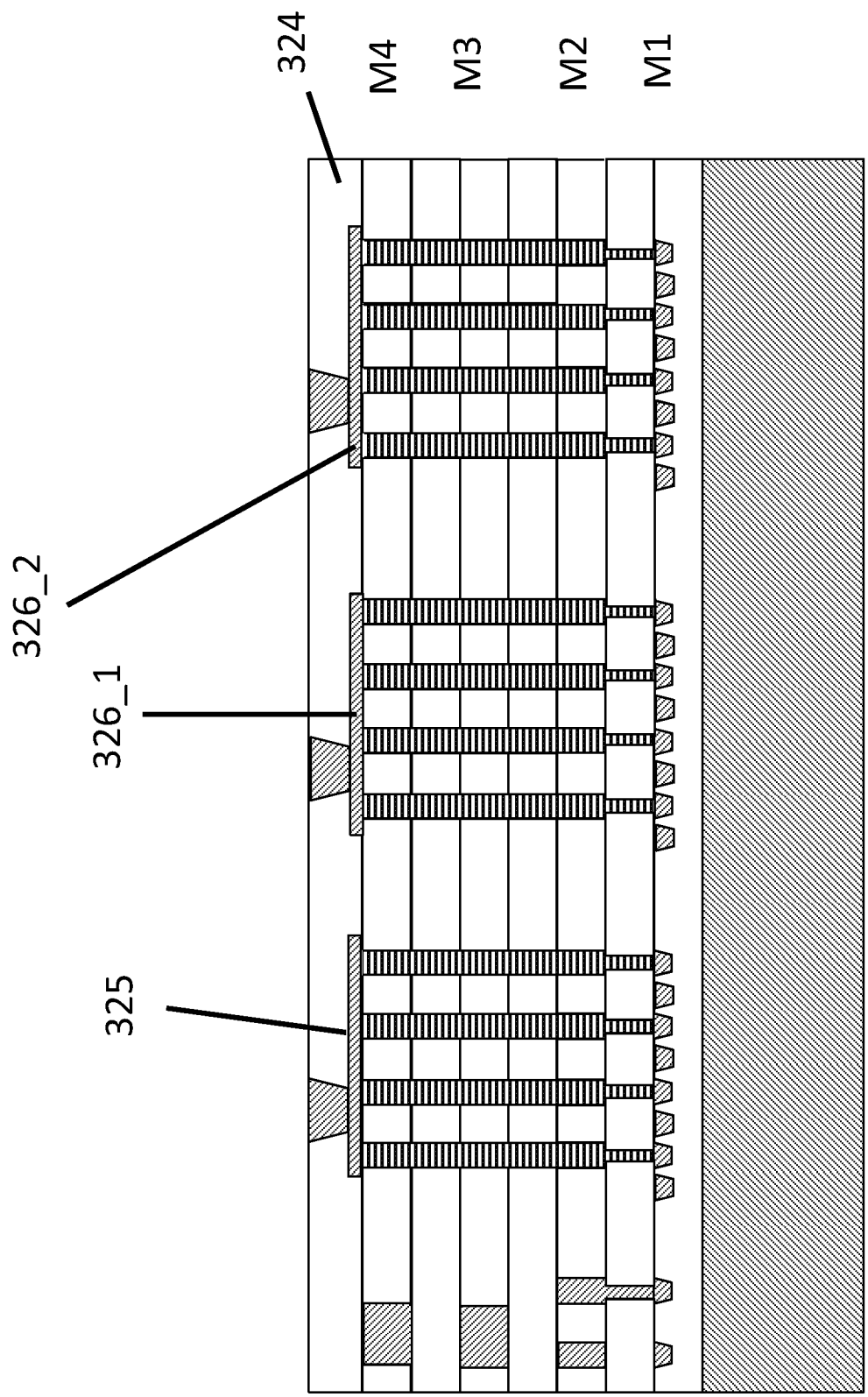

FIG. 3h shows topside processing of the storage cells with a metal plate structure 325 in the M5/M4 dielectric 324 above the DRAM cells and metal plate structures 326_1, 326_2 in the M5/M4 dielectric above the FeRAM cells. Here, the top electrodes of the DRAM cells are coupled to a same electrical node, such as a reference potential node. As such, metal plate structure 325 effectively shorts the top electrodes of the DRAM cells together. Thus, e.g., in an embodiment, all DRAM cells of a same embedded DRAM memory are connected to a same metal plate structure 325.

By contrast, in an embodiment, the FeRAM cells have a different circuit design that does not electrically connect the top electrode of all FeRAM cells to a same node. As such, as observed in FIG. 3h, different groups of FeRAM cells are coupled to different metal plate structures 326_1, 326_2. Here, as is understood in the art, words of a specific bit length are written to and read from a memory device. In the case of the FeRAM cells, each address that is received and decoded by the memory device activates only one of a plurality of storage cells that are coupled to a same bit-line. That is, each bit line is driven by a selected one of multiple storage cells that are coupled to the bit line.

As such, like the DRAM cells, the bottom electrode of each FeRAM cell is connected to that cell's access transistor which resides directly beneath the FeRAM cell. Unlike the DRAM cells, however, the top electrodes of the FeRAM cells are not coupled to a same reference node. Instead the respective top electrodes of FeRAM cells in a same groups are coupled to a common source node for that group. That is, each group of FeRAM cells in a same group or array share a common source node.

Figure 3I:
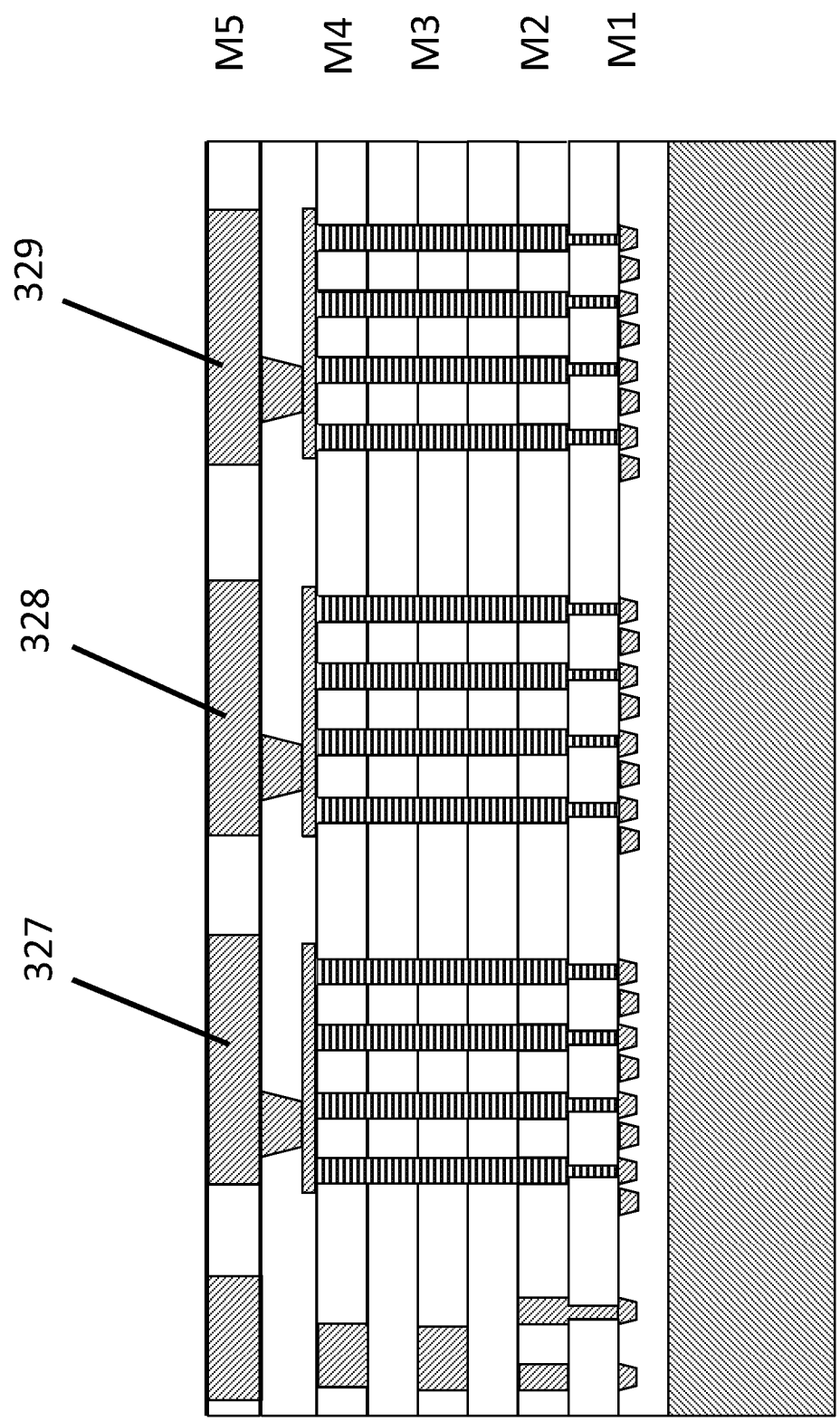

With the FeRAM embedded memory design coupling a group of FeRAM devices to a particular common source node, FIG. 3i depicts different source nodes 328, 329 within the embedded FeRAM device and shows different groups of storage cells being coupled to the different source nodes 328, 329. The different FeRAM source nodes 328, 329 are formed in the M5 metal layer. The reference node 327 that is coupled to the DRAM cells is also formed in the M5 metal layer.

Figure 3J:
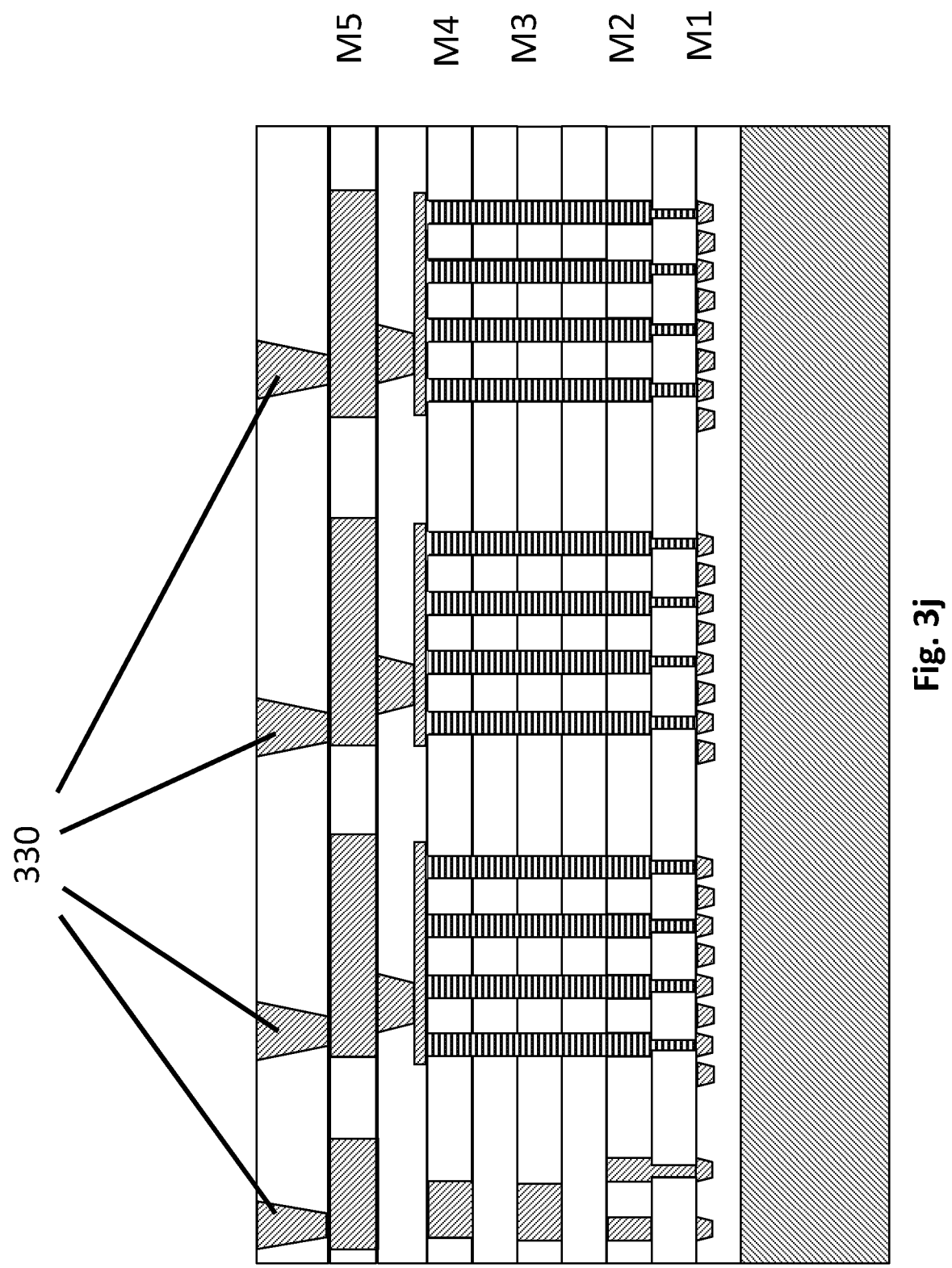
Figure 3K:
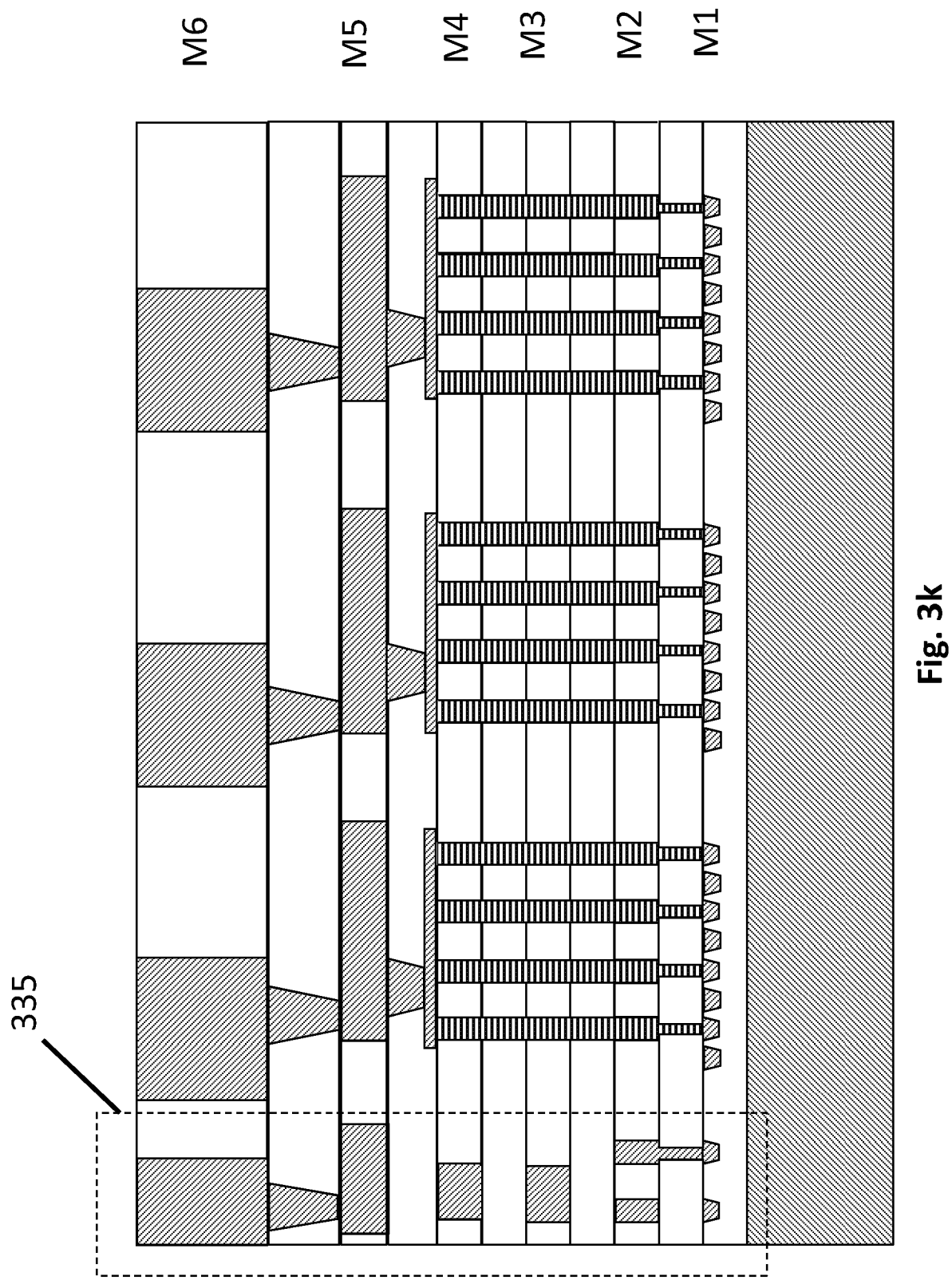

FIG. 3j shows formation of vias 330 in the M6/M5 interlayer dielectric 328 that make respective contact to the DRAM reference node 327 and the FeRAM source node structures 328, 329. FIG. 3k shows M6 metal structures that are used to couple the DRAM reference node 327 and the FeRAM source nodes 328, 329 to their correct respective interconnects. Note also that the logic circuitry portion 335 of the semiconductor chip has also been developed throughout the process described above with respect to FIGS. 3a through 3k.

After the features of FIG. 3k are formed, the remainder of the semiconductor chip is formed according to standard processes.

Although embodiments above have been directed to the formation of vias according to a traditional damascene process, in yet other embodiments, a self-aligned via approach may be used to form the storage cell trenches. Here, as is known in the art, self-aligned vias use already patterned metal (copper) as a hard mask for the etched into regions of the trenches.

FIGS. 4a through 4c pertain to other implementation details concerning an SOC having embedded FeRAM and DRAM cells. A characteristic of FeRAM cells vs DRAM cells is that FeRAM cells typically require a higher voltage when being written to or otherwise accessed as compared to DRAM cells. As such, an FeRAM cell's access transistor may have a thicker gate dielectric than a DRAM cell's access transistor.

FIG. 4a depicts this characteristic graphically where regions 401 correspond to regions where corresponding access transistors are located for the DRAM cells above them. Likewise, regions 402 correspond to regions where corresponding access transistors are located for the FeRAM cells above them. As can be seen from FIG. 4a regions 402 are larger than regions 401 to demonstrate that the FeRAM access transistors are larger than the DRAM access transistors.

FIGS. 4b and 4c elaborate further on embodiments of accessing details of DRAM cells versus FeRAM cells. FIG. 4b shows the accessing dynamics of DRAM cells whereas FIG. 4c shows the accessing dynamics of FeRAM cells.

Referring to FIG. 4b, a four bit word is written to or read from depending on which word line is activated. That is, in an embodiment, there is one word line per supported address and each word line is coupled to the respective access transistor of a number of DRAM cells equal to the word size of the overall DRAM memory. In the depiction of FIG. 4b, word line 410 is activated which enables the access transistors and corresponding DRAM cells of region 411. The bit lines of the DRAM cells within region 411 either present the stored data in these cells in the case of a read or present data to be written into these cells in the case of a write. Note that all the cells can share the same reference voltage node.

By contrast, FIG. 4c shows that in the case of an FeRAM memory different bits of a same memory word originate from different physical word lines. Here, sector A produces a first bit of a memory word and sector B produces a second bit of the memory word. As such, only one FeRAM cell in a sector are activated for any applied memory address. In the example of FIG. 4c, only FeRAM cells 420 and 421 are activated. As such, both of these FeRAM cells control their respective source nodes which is common to all cells within their respective sector. As discussed at length above, the top electrode of the FeRAM cells correspond to the source node and is connected to all FeRAM cells in a same sector. FeRAM cells in a same sector that are also coupled to a same word line are connected to the same word line through the bottom electrode metallurgy (e.g., at M1 in a direction orthogonal to the bitlines).

Although the discussion above has been directed to embodiments where the FeRAM cells have bit-lines that are located above the cells, in other embodiments the FeRAM cells may have their bit-lines disposed beneath the cells (e.g., as with COB DRAM cells). As such, embodiments may exist where the top electrodes of the FeRAM cells are coupled to a same reference node plate.

Although embodiments discussed above show only one level of DRAM and FeRAM cells, in various embodiments, there may be multi-levels of, e.g., at least FERAM cells. For example, an entire additional level of FeRAM cells may be formed above the FeRAM cells depicted in FIGS. 3m and 4a in higher level interconnect so as to form, e.g., a three-dimensional non volatile memory. Further still, although embodiments above have depicted DRAM and FeRAM cells of same height, in various embodiments the DRAM and FeRAM cells may have different heights. Conceivably a vertical stack of FeRAM cells could be formed over the same vertical expanse as a single DRAM cell. For instance, in reference to FIGS. 3m and 4a, conceivably, a different FeRAM cell could be formed in each of the M2, M3 and M4 levels so that a three-dimensional non volatile embedded memory is formed in the same vertical height dimension as a single embedded DRAM memory.

FIG. 5 shows a depiction of an exemplary computing system 500 such as a personal computing system (e.g., desktop or laptop) or a mobile or handheld computing system such as a tablet device or smartphone, or, a larger computing system such as a server computing system. As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function (peripheral control hub) 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502. The system memory 502 may be a multi-level system memory such as the multi-level system memory discussed at length above.

The host side processing cores 515, memory controller 517 and peripheral control hub 518 may be integrated on a system on chip that also includes embedded DRAM storage cells and embedded FeRAM storage cells as described at length above. The DRAM and FeRAM storage cells may be coupled to the memory controller 517 as parts of a multi-level system memory that is integrated on the system on chip. Alternatively or in combination, the FeRAM storage cells may be used for traditional non volatile mass storage (e.g., a solid state disk drive) and may be coupled to the peripheral control hub 518.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

An apparatus is described. The apparatus includes a semiconductor chip. The semiconductor chip includes logic circuitry, embedded dynamic random access memory (DRAM) cells and embedded ferroelectric random access memory (FeRAM) cells. In various embodiments the semiconductor chip is a system-on-chip and the logic circuitry is to implement: a plurality of processing cores, a memory controller and a peripheral control hub. In various embodiments at least a portion of the embedded FeRAM cells are components within a multi-level system memory. In various embodiments at least a portion of the embedded FeRAM cells are components within a mass storage portion of the semiconductor chip.

In various embodiments the semiconductor chip further includes DRAM cell access transistors and FeRAM cell access transistors, where, the DRAM cell access transistors are disposed beneath respective ones of the embedded DRAM cells and the FeRAM cell access transistors are disposed beneath respective ones of the embedded FeRAM cells. In various embodiments the FeRAM cell access transistors have a thicker gate electrode than DRAM cell access transistors. In various embodiments respective bit lines of the embedded DRAM cells reside beneath the embedded DRAM cells. In various embodiments respective bit lines of the embedded FeRAM cells reside beneath the FeRAM cells. In various embodiments respective common source nodes of the embedded FeRAM cells reside at a same metal level as reference potential node of the embedded DRAM cells. In various embodiments the embedded DRAM cells and the embedded FeRAM cells have the same structure.

A computing system has been described. The computing system includes a flat panel screen and a semiconductor chip. The semiconductor chip includes logic circuitry, embedded dynamic random access memory (DRAM) cells and embedded ferroelectric random access memory (FeRAM) cells. In various embodiments the semiconductor chip is a system-on-chip and the logic circuitry is to implement: a plurality of processing cores, a memory controller and a peripheral control hub. In various embodiments at least a portion of the embedded FeRAM cells are components within a multi-level system memory. In various embodiments at least a portion of the embedded FeRAM cells are components within a mass storage portion of the semiconductor chip.

In various embodiments the semiconductor chip further includes DRAM cell access transistors and FeRAM cell access transistors, where, the DRAM cell access transistors are disposed beneath respective ones of the embedded DRAM cells and the FeRAM cell access transistors are disposed beneath respective ones of the embedded FeRAM cells. In various embodiments the FeRAM cell access transistors have a thicker gate electrode than DRAM cell access transistors. In various embodiments respective bit lines of the embedded DRAM cells reside beneath the embedded DRAM cells. In various embodiments respective bit lines of the embedded FeRAM cells reside beneath the FeRAM cells. In various embodiments respective common source nodes of the embedded FeRAM cells reside at a same metal level as reference potential node of the embedded DRAM cells. In various embodiments the embedded DRAM cells and the embedded FeRAM cells have the same structure.

A method has been described. The method includes forming the on-die interconnect structure of a semiconductor chip by depositing and patterning layers of dielectric and metal, the depositing and patterning including forming logic circuitry, embedded DRAM cells and embedded FeRAM cells. In various embodiments the method further includes, prior to the forming of the embedded DRAM cells and the embedded FeRAM cells, forming smaller access transistors in the semiconductor substrate of the semiconductor die in locations beneath where respective MIM capacitors of the embedded DRAM cells are to be formed and forming larger access transistors in the semiconductor substrate of the semiconductor die in locations beneath where respective FeRAM devices of the embedded FeRAM cells are to be formed.

In various embodiments respective structures within the on-die interconnect structure include features of the logic circuitry, the embedded DRAM cells and the embedded FeRAM cells residing along a same metal level. In various embodiments the method further includes, prior to the forming of the embedded DRAM cells, forming embedded DRAM bit lines in the on-die interconnect structure in locations beneath where respective MIM capacitors of the embedded DRAM cells are to be formed. In various embodiments the method further includes forming embedded FeRAM bit lines beneath respective FeRAM devices of the embedded FeRAM cells.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip comprising:
logic circuitry;
embedded dynamic random access memory (DRAM) cells;
embedded ferroelectric random access memory (FeRAM) cells; and
DRAM cell access transistors and FeRAM cell access transistors, the DRAM cell access transistors disposed beneath respective ones of the embedded DRAM cells, the
FeRAM cell access transistors disposed beneath respective ones of the embedded FeRAM cells.

2. The apparatus of claim 1 wherein the semiconductor chip is a system-on-chip and the logic circuitry is to implement:
a plurality of processing cores;
a memory controller;
a peripheral control hub.

3. The apparatus of claim 1 wherein at least a portion of the embedded FeRAM cells are components within a multi-level system memory.

4. The apparatus of claim 1 wherein at least a portion of the embedded FeRAM cells are components within a mass storage portion of the semiconductor chip.

5. The apparatus of claim 1 wherein the FeRAM cell access transistors have a thicker gate electrode than DRAM cell access transistors.

6. The apparatus of claim 1 wherein respective bit lines of the embedded DRAM cells reside beneath the embedded DRAM cells.

7. The apparatus of claim 1 wherein respective bit lines of the embedded FeRAM cells reside beneath the FeRAM cells.

8. The apparatus of claim 1 wherein respective common source nodes of the embedded FeRAM cells reside at a same metal level as reference potential node of the embedded DRAM cells.

9. A computing system, comprising:
a flat panel screen;
a semiconductor chip comprising:
logic circuitry;

embedded dynamic random access memory (DRAM) cells;

embedded ferroelectric random access memory (FeRAM) cells; and

DRAM cell access transistors and FeRAM cell access transistors, the DRAM cell access transistors disposed beneath respective ones of the embedded DRAM cells, the FeRAM cell access transistors disposed beneath respective ones of the embedded FeRAM cells.

10. The computing system of claim 9 wherein the semiconductor chip is a system-on-chip and the logic circuitry is to implement: a plurality of processing cores; a memory controller; a peripheral control hub.

11. The computing system of claim 9 wherein at least a portion of the embedded FeRAM cells are components within a multi-level system memory.

12. The computing system of claim 9 wherein at least a portion of the embedded FeRAM cells are components within a mass storage portion of the semiconductor chip.

13. The computing system of claim 9 wherein the DRAM cell access transistors are smaller than the FeRAM cell access transistors.

14. The computing system of claim 9 wherein respective bit lines of the embedded DRAM cells reside beneath the embedded DRAM cells.

15. The computing system of claim 9 wherein respective bit lines of the embedded FeRAM cells reside beneath the FeRAM cells.

16. The computing system of claim 9 wherein respective common source nodes of the embedded FeRAM cells reside at a same metal level as reference potential node of the embedded DRAM cells.

17. The computing system of claim 9 wherein the embedded DRAM cells and the embedded FeRAM cells have the same structure.

18. An apparatus, comprising:
a semiconductor chip comprising:
logic circuitry;
embedded dynamic random access memory (DRAM) cells, wherein respective bit lines of the embedded DRAM cells reside beneath the embedded DRAM cells; and
embedded ferroelectric random access memory (FeRAM) cells.

19. An apparatus, comprising:
a semiconductor chip comprising:
logic circuitry;
embedded dynamic random access memory (DRAM) cells; and
embedded ferroelectric random access memory (FeRAM) cells, wherein respective bit lines of the embedded FeRAM cells reside beneath the FeRAM cells.

20. An apparatus, comprising:
a semiconductor chip comprising:
logic circuitry;
embedded dynamic random access memory (DRAM) cells; and
embedded ferroelectric random access memory (FeRAM) cells, wherein respective common source nodes of the embedded FeRAM cells reside at a same metal level as reference potential node of the embedded DRAM cells.

* * * * *